(12) United States Patent
Chen et al.

(10) Patent No.: US 6,757,193 B2
(45) Date of Patent: Jun. 29, 2004

(54) CODING METHOD OF MULTI-LEVEL MEMORY CELL

(75) Inventors: Chia-Hsing Chen, Hsinchu (TW); Cheng-Jye Liu, Taoyuan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 133 days.

(21) Appl. No.: 10/115,799

(22) Filed: Apr. 3, 2002

(65) Prior Publication Data

US 2002/0181278 A1 Dec. 5, 2002

(30) Foreign Application Priority Data

May 31, 2001 (TW) ........................................ 90113161 A

(51) Int. Cl.[7] .............................................. G11C 16/04
(52) U.S. Cl. ........................... 365/185.03; 365/185.09; 365/185.24; 365/185.33; 365/185.04
(58) Field of Search ....................... 365/185.03, 185.09, 365/185.24, 185.33, 185.04

(56) References Cited

U.S. PATENT DOCUMENTS

| | | | | |
|---|---|---|---|---|
| 6,262,913 | B1 | * | 7/2001 | Hutchison ............... 365/185.09 |
| 6,266,270 | B1 | * | 7/2001 | Nobukata ............... 365/185.03 |
| 6,400,601 | B1 | * | 6/2002 | Sudo et al. ............ 365/185.03 |
| 6,560,143 | B2 | * | 5/2003 | Conley et al. ......... 365/185.04 |

* cited by examiner

*Primary Examiner*—Connie C. Yoha
(74) *Attorney, Agent, or Firm*—J.C. Patents

(57) ABSTRACT

A coding method of a multi-level cell, applied to a programming operation of a multi-level memory cell. The multi-level memory cell can store n bits and has $2^n$ levels with respect to $2^n$ codes. Each code is constructed with n bits. In the coding method, a code to be stored is provided. According to a relationship between the code and level, the multi-level memory cell has a specified level for corresponding code to be stored. The relationship is a correspondence between the $2^n$ codes and the $2^n$ levels. Two codes corresponding to any neighboring two levels has only a one-bit difference.

17 Claims, 2 Drawing Sheets

US 6,757,193 B2

CODING METHOD OF MULTI-LEVEL MEMORY CELL

CROSS-REFERENCE TO RELATED APPLICATION

This application claims the priority benefit of Taiwan application serial no. 90113161, filed May 31, 2001.

BACKGROUND OF THE INVENTION

1. Field of the Invention

The invention relates in general to a coding method for a data storage medium, and more particularly, to a coding method of a multi-level memory cell.

2. Description of the Related Art

Multi-level memory cell is a kind of memory cell that comprises n (N>1) bits and has $2^n$ levels to store one of $2^n$ codes. Each code is formed with n bits. The value of the $2^n$ codes is 0 to $2^n-1$. "Multi-level" means that the memory cell can have multiple threshold voltages $V_T$. For a certain kind of multi-level memory cell, the threshold voltage is set as one of the $2^n$ levels for programming. The threshold voltage is then used to determine the stored code for reading. This kind of multi-level memory cell includes electrically erasable programmable read only memory (EEPROM) or mask read only memory (Mask ROM). On the other hand, for the multi-level memory cell in the dynamic random access memory (DRAM), the gate voltage is set to $2^n V_T$, SO that the capacitor has a certain voltage, and the certain voltage is retrospectively referred to obtain the stored data for reading.

The conventional coding method of a multi-level memory cell is to arrange according to the values of $2^n$ codes, and then correspond to each level from low to high sequentially. In FIG. 1, a multi-level memory cell with 2 bits is used as an example. In the conventional method, the codes are (11), (10), (01) and (00) with respect to the first to the fourth levels from low to high. In FIG. 2, a multi-level memory cell with 3 bits is used as an example. The codes are (111), (110), (101), (100), (011), (010), (001) and (000) with respect to the first level 201 to the eighth levels 208, from low to high.

Although the multi-level memory cell can store massive amounts of information, the large number of levels causes errors of storing another code of the level before or after the exact level of which a specified code is to be stored. Thus, the error code correction (ECC) is very important. Such error code correction compares the actual storage value to the predetermined storage value after programming the memory cell. The error address of the memory cell and the bit record requiring correction are saved into an additional memory cell.

A common error code correction rule includes a $2^q+2q-1$ rule. That is, 2q-1 additional spaces are given to store the error code correction data in each $2^q$ bits of data of a memory, whereas, 2q-2 bits are used to stored the address of the error memory cells and the remaining one bit is used to store the corrected bit. When the probability of the error occurrence for data storage is high, the value of q has to be reduced to increase the proportion of the error code correction memory cells $((2q-1)/2^q)$. That is, with the same data storage spaces, more additional spaces are consumed to store error data, and vice versa.

In FIG. 1, in the conventional coding method of a 2 bit multi-level memory cell, the bit difference between two codes of two neighboring levels is 1, 2, 1, sequentially. That is, if one mistakenly writes (01) as (10) or (10) as (01), the corrected bit number to be stored is 2. Referring to FIG. 2, in the conventional coding method of a 3 bit multi-level memory cell, the bit difference between two codes of two neighboring levels is 1, 2, 1, 3, 1, 2, 1 in sequence. The corrected bit number is even more. In the conventional coding method, more than one error bits are generated when one memory cell is wrongly written. More storage spaces of the memory are thus consumed.

SUMMARY OF THE INVENTION

The invention provides a coding method of a multi-level memory cell applied to a programming operation of a multi-level memory cell. The multi-level memory cell can store n bits and has $2^n$ levels with respect to $2^n$ codes. Each code comprises n bits. In the coding method, a code to be stored is provided. According to a relationship between the code and level, a specified level of the code to be stored is obtained by the multi-level memory cell. The relationship between the code and the level is a correspondence between the $2^n$ codes and the $2^n$ levels. Two codes of any two corresponding neighboring levels have a one bit difference.

In the above coding method of multi-level memory cell, the range of n is $2 \leq n \leq 4$.

The invention further provides a programming method of a multi-level memory cell. Data is written to a multi-level memory cell using the above coding method. An error code inspection step is performed. If the actual stored code of any memory cell has one bit different from the predetermined stored code, the address of this multi-level memory cell and the different bit are written into an additional error code correction memory cell.

As mentioned above, since two codes of two neighboring levels only have one bit difference, whatever n is, when a specified code of a corresponding level is mistakenly written as another code of the level right before or after such certain level, only one additional correction bit is required. The number for a correction bit is thus decreased, and the space occupied by storing the correction bit is saved.

Both the foregoing general description and the following detailed description are exemplary and explanatory only and are not restrictive of the invention, as claimed.

DESCRIPTION OF THE PREFERRED EMBODIMENTS

As the adjusting and modifying process of the multi-level memory cell is not the features of the invention, and a description has been given as above, the description of the invention is focused on the relationship between the code-level used in the coding method hereinafter.

Figure 1:
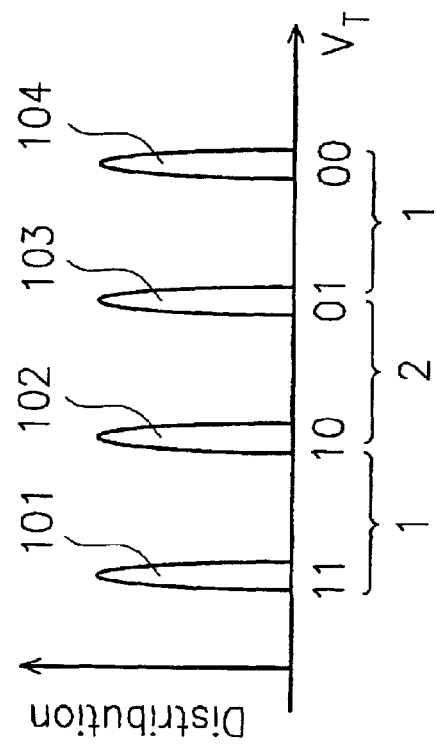
FIG. 1 shows a coding method of a 2-bit multi-level memory cell and the difference in bit number between two neighboring levels according to conventional art.
Figure 2:
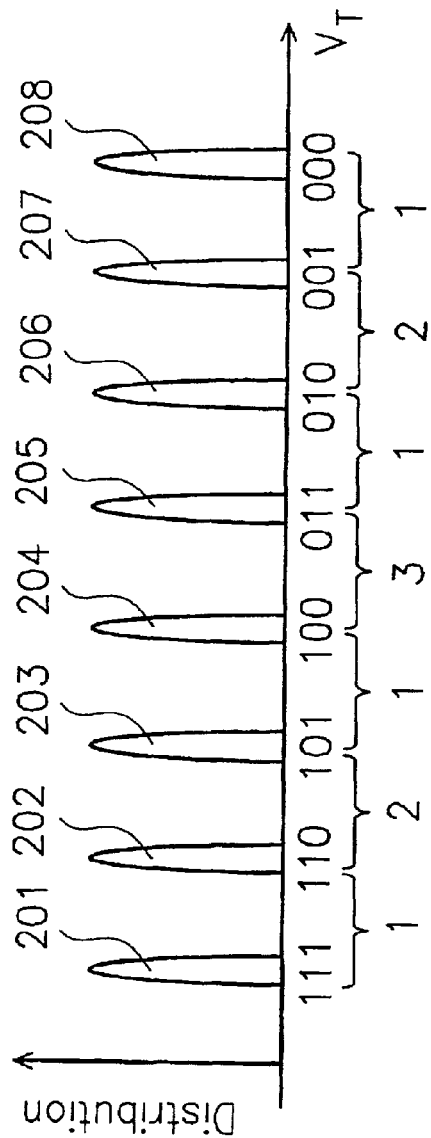
FIG. 2 shows a coding method of a 3-bit multi-level memory cell and the difference in bit number between two neighboring levels according to conventional art.
Figure 3:
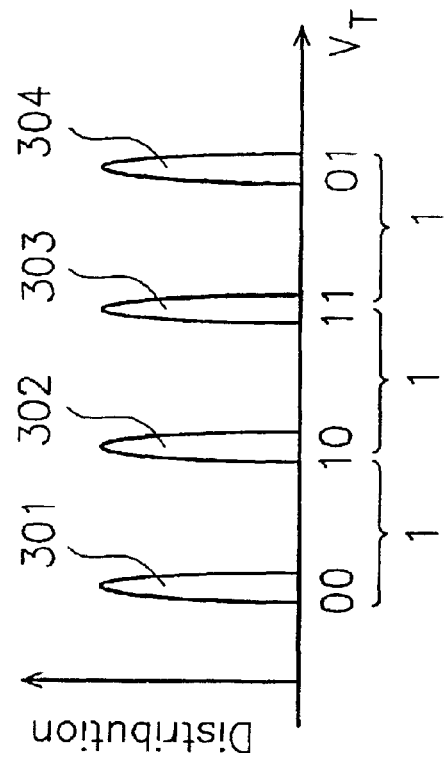
FIG. 3 shows a coding method of a 2-bit multi-level memory cell and the difference in bit number between two neighboring levels according to this invention.

FIG. 3 shows the relationship between the code and the level for a 2 bit multi-level memory cell and the bit difference of the two-bit codes of two neighboring two levels. As shown in FIG. 3, the codes of the first level 301 to the fourth level 304 include (00), (10), (11) and (01) from low to high. The codes between two neighboring levels has a one-bit difference.

Figure 4:
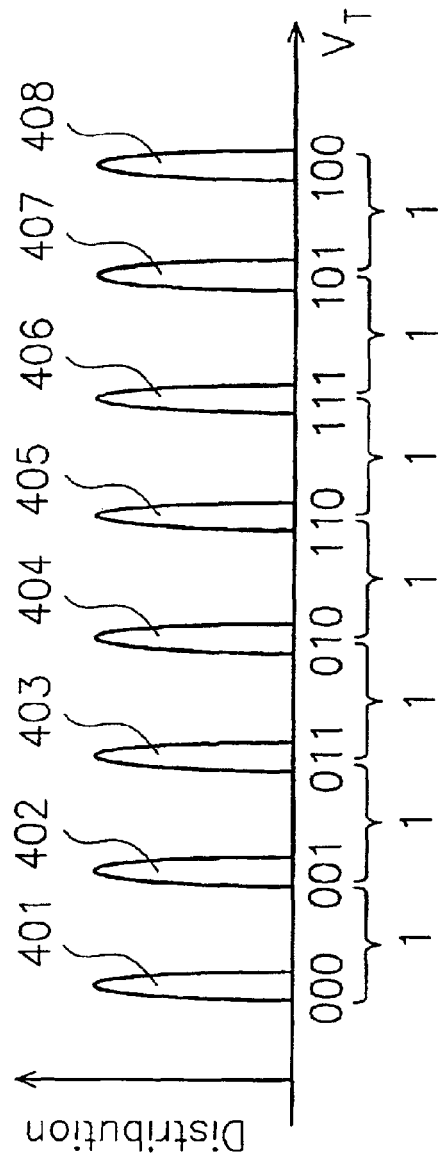
FIG. 4 shows a coding method of a 3-bit multi-level memory cell and the difference in bit number between two neighboring levels according to this invention.

FIG. 4 shows the relationship between the code and level for a 3-bit multi-level memory cell, and the bit difference between the codes corresponding to two neighboring levels according to this invention. As shown in FIG. 4, the codes corresponding to the first level 401 to the eighth level 408 are (000), (001), (011), (010), (110), (111), (101) and (100), from low to high. There is only a one-bit difference between the codes of two neighboring levels.

To the 2-bit multi-level memory cell, the code corresponding to the lowest level can be (01), (10) or (11) as long as the code corresponding to each level has a one bit difference from the code corresponding to its previous level. Similarly, to the 3-bit multi-level memory cell, the code corresponding lowest level can be (001), (010), (011), (100), (101), (110) or (111) only if the code corresponding to each level has a one-bit difference from the code corresponding to its previous level.

Furthermore, the coding method provided by this invention can be applied to a multi-level memory cell comprising the error code correction function, for example, the multi-level flash EEPROM, flash erasable programmable read only memory (flash EPROM), EEPROM, Mask ROM, or dynamic random access memory (DRAM).

As mentioned above, as two codes of two neighboring levels have only a one-bit difference, whether n is 2 or 3, when one specific code is wrongly written as another of the level ahead or behind, only one correction bit is stored for the error code correction. The total number of correction bit can thus be saved, and the space occupied for ECC memory cell can also be saved. The previously mentioned ECC design rule for a "$2^q+(2q-1)$ bits ECC memory cell" is used as an example, such that the advantages of this invention can be illustrated by actual numbers.

When the error rate for memory cell programming (level adjustment) is the same, the error bit proportion caused by the coding method of this invention is lower than that of the conventional coding method. Thus, if q has to be 8 in the conventional coding method, that is, a 15 bits error data storage space is required for each 256 bits storage space, the value of q can be increased to 9 in this invention. That is, each 512 bits storage space requires only a 17 bits error storage space to store all the error data. Therefore, using the coding method provided by this invention, the ECC memory has a proportion of 17/512=0.033, which is about a half of that (15/256=0.059) for the conventional coding method.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A coding method multi-level memory cell, applied to a multi-level memory cell, wherein the multi-level memory has a storage capacity of n bits and has $2^n$ codes of $2^n$ levels, wherein each code comprises n bits, the coding method comprising:

providing a code to be stored, wherein the code to be stored belongs to one of the $2^n$ codes; and obtaining a specified level corresponding to the code to be stored for the multi-level memory cell according to a relationship between the $2^n$ code and the $2^n$ level; wherein:

the specified level belongs to one of the $2^n$ levels; and two codes of any two neighboring two levels have an one bit difference, wherein a size for storing error code corrections is reduced.

2. The coding method according to claim 1, wherein $2 \leq n \leq 4$.

3. The coding method according to claim 1, wherein n=2, and a number of the levels is 4.

4. The coding method according to claim 3, wherein the levels comprise a first to a fourth levels from high to low, and a code corresponding to the first level is (00), (01), (10) or (11).

5. The coding method according to claim 3, wherein the levels comprise a first to a fourth levels from high to low, and codes corresponding to the first to the fourth levels include (01), (11), (10), (00).

6. The coding method according to claim 1, wherein n=3, and a number of the levels is 8.

7. The coding method according to claim 6, wherein the levels comprise a first to a eighth levels from high to low, and a code corresponding to the first level is (000), (001), (010), (011), (100), (101), (110) or (111).

8. The coding method according to claim 6, wherein the levels comprise a first to an eighth levels from low to high, and codes corresponding to the first to the eighth levels include (000), (001), (011), (010), (110), (111), (101), (100).

9. The coding method according to claim 1, wherein the multi-level memory cell includes a flash electrically erasable programmable read only memory (flash EEPROM) cell.

10. The coding method according to claim 1, wherein the multi-level memory cell includes a flash erasable programmable read only memory (flash EPROM) cell.

11. The coding method according to claim 1, wherein the multi-level memory cell includes an erasable programmable read only memory (EPROM) cell.

12. The coding method according to claim 1, wherein the multi-level memory cell includes a mask read only memory (Mask ROM) cell.

13. The coding method according to claim 1, wherein the multi-level memory cell includes a dynamic random access memory (DRAM) cell.

14. A coding method multi-level memory cell, applied to a multi-level memory cell having a storage capacity of n bits and having $2^n$ codes of $2^n$ levels, wherein each code comprises n bits, the coding method comprising:

providing a predetermined code, wherein the code to be stored belongs to one of the $2^n$ codes; and obtaining a predetermined level corresponding to the code to be stored for the multi-level memory cell according to a relationship between the $2^n$ code and the $2^n$ level; wherein:

the predetermined level belongs to one of the $2^n$ levels, and two codes of any two neighboring two levels have an one bit difference, wherein a size for storing error code corrections is reduced; and an actual stored code of the multi-level memory cell is checked to compare a difference between predetermined code and the actual stored code, and when a specified bit difference exists between the predetermined code and the actual stored code, an address of the multi-level memory cell and the specified bit are recorded.

15. A programming method of a multi-level memory, applied to a multi-level memory comprising a plurality of multi-level memory cells and a plurality of error code correction memory cells, wherein each of the multi-memory cell has a storage capacity of n bits and has $2^n$ codes corresponding to $2^n$ levels, and wherein each of the codes comprises n bits, the programming method comprising:

provinding a plurality of predetermined codes covered in the $2^n$ codes;

storing the predetermined codes in the multi-level memory, wherein each multi-level memory cell has a specified level according to a relationship of code-level, and the relationship of code-level is a relationship between the $2^n$ codes and the $2^n$ levels, and two codes of any two neighboring levels have an one-bit difference, wherein a size for storing error code corrections is reduced; and checking a plurality of actual codes stored in the multi-level memory cells, wherein each actual code is compared to each of the predetermined codes, and when a specified bit difference is checked between any of the predetermined codes and any of the actual stored codes, an address of any of the multi-level cells and the specified code are recorded in the error code correction memory cells.

16. The programming method according to claim 15, wherein the multi-level memory cells comprise $2^q$ bits, the error code correction memory cells comprise 2q−1 bits, and q is an integer.

17. The programming method according to claim 16, wherein q=9.

* * * * *